(12) United States Patent
Zhang et al.

(10) Patent No.: US 12,156,352 B2
(45) Date of Patent: Nov. 26, 2024

(54) ARC-SHAPED LOCK AND DISPLAY SCREEN ASSEMBLY

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhengqiang Li, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/789,783

(22) PCT Filed: May 24, 2022

(86) PCT No.: PCT/CN2022/094608
§ 371 (c)(1),
(2) Date: Jun. 29, 2022

(87) PCT Pub. No.: WO2023/010954
PCT Pub. Date: Feb. 9, 2023

(65) Prior Publication Data
US 2024/0179862 A1 May 30, 2024

(30) Foreign Application Priority Data
Aug. 6, 2021 (CN) .......................... 202110904477.2

(51) Int. Cl.
*H05K 5/02* (2006.01)
*H05K 5/00* (2006.01)

(52) U.S. Cl.
CPC ......... *H05K 5/0221* (2013.01); *H05K 5/0021* (2013.01)

(58) Field of Classification Search
CPC ...................................................... H05K 5/00
See application file for complete search history.

(56) References Cited

FOREIGN PATENT DOCUMENTS

| CN | 212318523 U | 1/2021 | |
| WO | WO-2014040355 A1 * | 3/2014 | ........... G09F 9/3026 |

OTHER PUBLICATIONS

European Search Report of Counterpart European Patent Application No. 22731976.1 issued on Sep. 13, 2023.

* cited by examiner

*Primary Examiner* — Jerry Wu

(57) ABSTRACT

Provided is an arc-shaped lock and display screen assembly, the arc-shaped lock comprises a first lock body and a second lock body; the first lock body comprises an angle adjusting component, a disengagement set, a locking set and a locking piece, the angle adjusting component is used for adjusting a splicing angle, the angle adjusting component is internally provided with a cavity for accommodating the disengagement set, the locking set is provided in the disengagement set, and the locking piece is arranged on outer wall of the locking set; the second lock body comprises a lock bar, which is provided with a slot, the disengagement set moves relative to the locking set, so that the locking piece moves toward the lock bar under extrusion force of the disengagement set, and is locked in the slot to realize temporary fixation of the first lock body and the second lock body.

17 Claims, 6 Drawing Sheets

ARC-SHAPED LOCK AND DISPLAY SCREEN ASSEMBLY

TECHNICAL FIELD

The application belongs to the technical field of display screens, and in particular relates to an arc-shaped lock and a display screen assembly.

BACKGROUND

Display screen is used to display information such as text, image, video and clip. Because of its advantages of high brightness, low working voltage, low power consumption, large scale, long life, impact resistance and stable performance, display screen has been widely used in many fields.

At present, the large display screen is made up of several small display screen unit spliced by locking devices. However, the existing locking devices are complicated to install and disassemble, which affects the splicing efficiency.

SUMMARY

The technical problem to be solved by the application is that the existing locking devices are complicated in splicing display screens, and aiming at the problem, the application provides an arc-shaped lock and a display screen assembly.

To solve the above technical problem, in one aspect, the embodiment of the present application provides an arc-shaped lock for splicing two adjacent display screen units, including a first lock body and a second lock body;
  the first lock body includes an angle adjusting component, a disengagement set, a locking set and a locking piece, the angle adjusting component is used for adjusting a splicing angle between two adjacent display screen units, the angle adjusting component is internally provided with a cavity for accommodating the disengagement set, the disengagement set is sleeved outside the locking set, and the locking piece is arranged on an outer wall of the locking set; and
  the second lock body includes a lock bar, the lock bar is provided with a slot, and the lock bar is capable to extend into the locking set to make the disengagement set move relative to the locking set, the locking piece is pushed by the disengagement set to move toward the lock bar in the locking set, so that the locking piece is locked in the slot of the lock bar to realize temporary fixation of the first lock body and the second lock body.

Optionally, the disengagement set includes a first set segment and a second set segment, and the thickness of the second set segment is smaller than that of the first set segment, an outer wall of the locking set is provided with an embedding slot, the locking piece is arranged at a gap formed by the embedding slot and the second set segment, and the first set segment is used to extrude the locking piece when the locking set and the disengagement set move relative to each other.

Optionally, one end of the locking set close to the lock bar is provided with a flange, and the angle adjusting component is provided with a locking set screw, the locking set screw abuts against one side of the flange to fix the flange between an inner wall of the cavity and the locking set screw.

Optionally, the first lock body further includes a button, a button push rod, a set spring, a button spring and a lock bar push piece; the button is installed at one end of the button push rod, another end of the button push rod is connected with the disengagement set, the set spring is sleeved outside the button push rod, and the set spring is arranged in the cavity; and
  the lock bar push piece is arranged in the locking set, and the button spring is connected between the lock bar push piece and the locking set.

Optionally, a counterbore is arranged on the disengagement set, and a waist hole is arranged on the locking set, and the counterbore is connected with the waist hole to limit movement stroke of the disengagement set outside the locking set.

Optionally, the first lock body further includes a fixed seat, and the angle adjusting component includes an angle adjuster and an angle rotating seat, and the angle adjuster is screwed outside the angle rotating seat, the angle rotating seat is installed on the fixed seat, the fixed seat is provided with a second positioning hole, the angle rotating seat is provided with a second positioning post, and the second positioning post is inserted into the second positioning hole.

Optionally, the second lock body further includes a lock bar connecting seat and an abutting block, the abutting block is arranged at one side of the lock bar connecting seat facing the first lock body, a plurality of inclined planes are uniformly arranged on an end surface of the angle adjuster facing the lock bar connecting seat in circumferential direction, and the angle adjuster rotates to make different inclined planes abut against the abutting block to change the splicing angle between two adjacent display screen units.

Optionally, the second lock body further includes a reset spring, a limit pin and a locking wrench, a lock bar channel is arranged on the lock bar connecting seat, and the lock bar passes through the lock bar channel to enter or exit the first lock body; an end of the lock bar away from the first lock body is provided with an external thread, the locking wrench is screwed on the lock bar, the reset spring is sleeved on the lock bar, and the reset spring is positioned between the lock bar connecting seat and the locking wrench; the lock bar is provided with a sliding groove, and the limit pin is fitted in the sliding groove.

In another aspect, the embodiment of the present application provides a display screen assembly, including a plurality of display screen units and a plurality of the arc-shaped locks, and two adjacent display screen units are spliced by the arc-shaped locks.

Optionally, two adjacent display screen units are spliced by two arc-shaped locks, at a joint of two adjacent display screen units, one of the display screen units is provided with a first lock body, and the other display screen unit is provided with a second lock body.

According to the arc-shaped lock provided by the embodiment of the application, in the process of splicing the display screen units, once the splicing angle is determined, the splicing angle is adjusted by the angle adjusting component, the lock bar of the second lock body extends into the first lock body, and when the disengagement set moves relative to the locking set, the locking piece contacts the disengagement set, the disengagement set would push the locking piece, so that the locking piece enters into the locking set and is clamped in the slot on the lock bar. Thereby, the first lock body and the second lock body are interlocked to connect two adjacent display screen units together. By using the arc-shaped lock provided by the embodiment of the application, the splicing process of the display screen unit can be simplified, the installation and disassembly are simple and convenient, and the splicing efficiency of the display screen is greatly improved.

Figure 1:
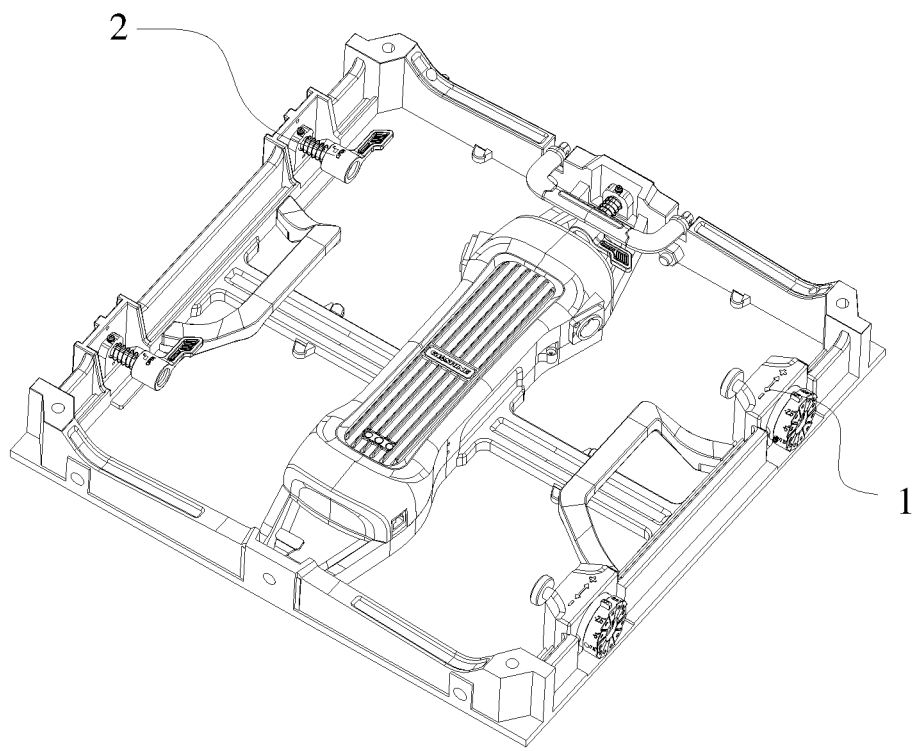
FIG. 1 is a schematic diagram of the positions of a first lock body and a second lock body provided by an embodiment of the present application.

Reference signs in the drawings are as follows:
1. First lock body; 101. Angle adjuster; 1011. Inclined plane; 1012. Glass bead groove; 1013. Third positioning hole; 102. Angle rotating seat; 1021. Second positioning post; 103. Cavity; 104. Locking set screw; 105. Disengagement set; 1051. First set segment; 1052. Second set segment; 1053. Counterbore; 106. Locking set; 1061. Flange; 1062. First positioning post; 1063. Embedding slot; 1064. Waist hole; 107. Locking piece; 108. Fixed seat; 1081. Second positioning hole; 109. Button; 110. Button push rod; 112. Button spring; 113. Set spring; 114. Lock bar push piece; 115. Glass bead screw; 116. Lock fixing screw;
2. Second lock body; 21. Lock bar; 211. Slot; 212. Sliding groove; 22. Lock bar connecting seat; 221. Lock bar channel; 23. Abutting block; 24. Third positioning post; 25. Reset spring; 26. Limit pin; 27. Locking wrench;
3. Display screen unit.

DETAILED DESCRIPTION OF DISCLOSED EMBODIMENTS

In order to make the technical problems, technical solutions and beneficial effects of the present application clearer, the present application will be further explained in detail with reference to the drawings and embodiments. It should be understood that the specific embodiments described here are only for illustrating the present application, not for limiting the present application.

As shown in FIGS. 1 to 10, in an aspect, an embodiment of the present application provides an arc-shaped lock, which includes a first lock body 1 and a second lock body 2, the first lock body 1 is installed on a display screen unit, the second lock body 2 is installed on another display screen unit, and the first lock body 1 and the second lock body 2 are connected to realize the splicing of two adjacent display screen units.

The first lock body 1 includes an angle adjusting component, a disengagement set 105, a locking set 106 and a locking piece 107, and the angle adjusting component is used for adjusting the splicing angle of two adjacent display screen units 3, so that a flat or curved spliced display screen can be obtained. The angle adjusting component is internally provided with a cavity 103 for accommodating the disengagement set 105, the disengagement set 105 is sleeved outside the locking set 106, the disengagement set 105 can slide outside the locking set 106, and the locking piece 107 is arranged on the outer wall of the locking set 106.

the second lock body 2 includes a lock bar 21, the lock bar 21 is provided with a slot 211, and the lock bar 21 can extend into the first lock body 1 to make the disengagement set 105 move outside the locking set 106, so that the locking piece 107 moves toward the locking bar 21 inside the locking set 106 under the pushing and compression of the disengagement set 105, and the locking piece 107 is locked in the slot 211 of the lock bar 21 to temporarily fix the first lock body 1 and the second lock body 2.

In the present application, in the process of splicing the display screen unit 3, once the splicing angle is determined, the angle is adjusted by the angle adjusting component, the lock bar 21 extends into the first lock body 1, and when the disengagement set 105 moves relative to the locking set 106, the locking piece 107 contacts the disengagement set 105, and the disengagement set 105 pushes the locking piece 107, so that the locking piece 107 enters the locking set 106 and is clamped in the slot 211 of the lock bar 21, realizing the interlocking of the first lock body 1 and the second lock body 2, thereby connecting two adjacent display screen units 3 together. By using the arc-shaped lock provided by the embodiment of the application, the splicing process of the display screen unit can be simplified, the installation and disassembly are simple and convenient, and the splicing efficiency of the display screen is greatly improved.

Figure 7:
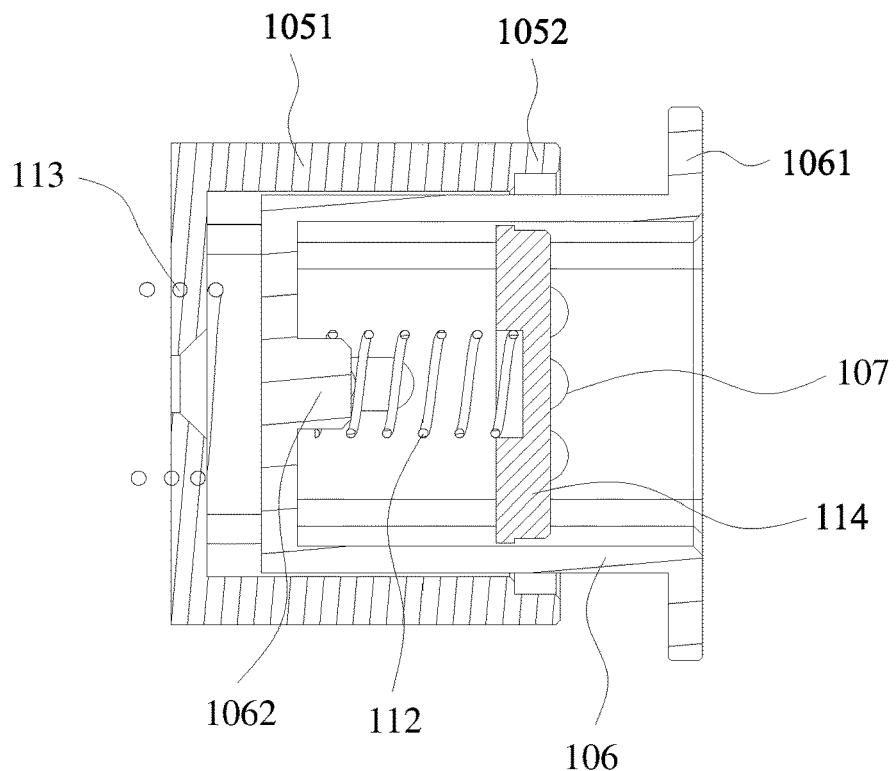
FIG. 7 is a schematic diagram of the cooperation between a disengagement set and a locking set provided by an embodiment of the present application.

As shown in FIG. 7, in an embodiment, the disengagement set 105 includes a first set segment 1051 and a second set segment 1052, and the thickness of the second set segment 1052 is smaller than that of the first set segment 1051, so that the junction of the first set segment 1051 and the second set segment 1052 forms a stepped structure, the outer wall of the locking set 106 is provided with an embedding slot 1063, the embedding slot 1063 penetrates the outer wall of the locking set 106, the locking piece 107 is arranged at the gap formed by the embedding slot 1063 and the second set segment 1052. When the locking set 106 and the disengagement set 105 move relatively, the first set segment 1051 at the stepped structure presses the locking piece 107, and the locking piece 107 enters the locking set 106 from the embedding slot 1063.

In an embodiment, the locking piece 107 is a locking marble, the locking marble is arranged in the embedding slot 1063, the locking marble is spherical, and it is easier to push when the first set segment 1051 pushes the locking marble. Preferably, each side of the locking set 106 is provided with three locking marbles, and when the angle adjusting component adjusts the angle, the slot 211 interlocks with the locking marbles at different positions under the condition of meeting different angle requirements.

Figure 4:
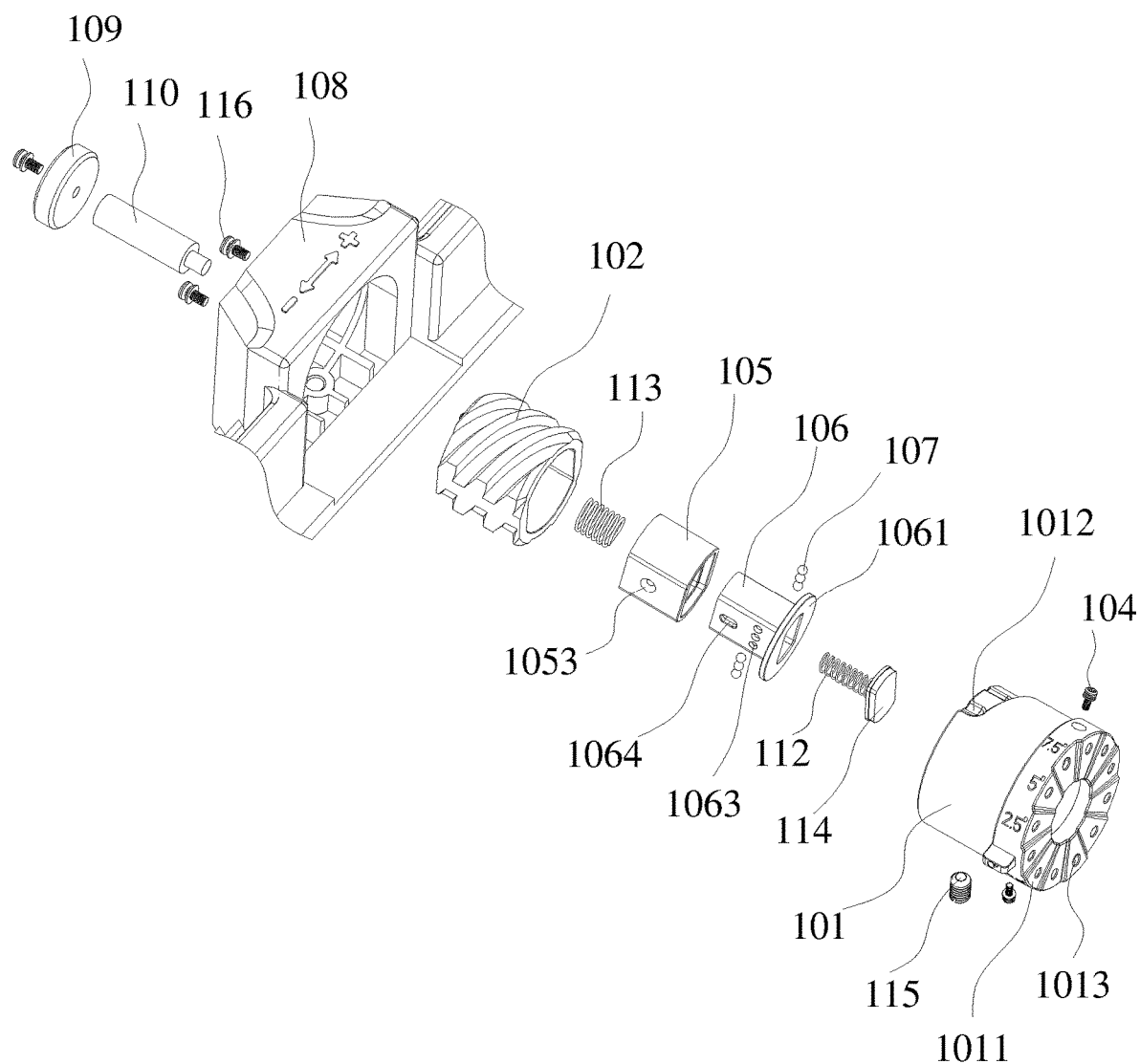
FIG. 4 is an exploded view of a first lock body provided by an embodiment of the present application.
Figure 6:
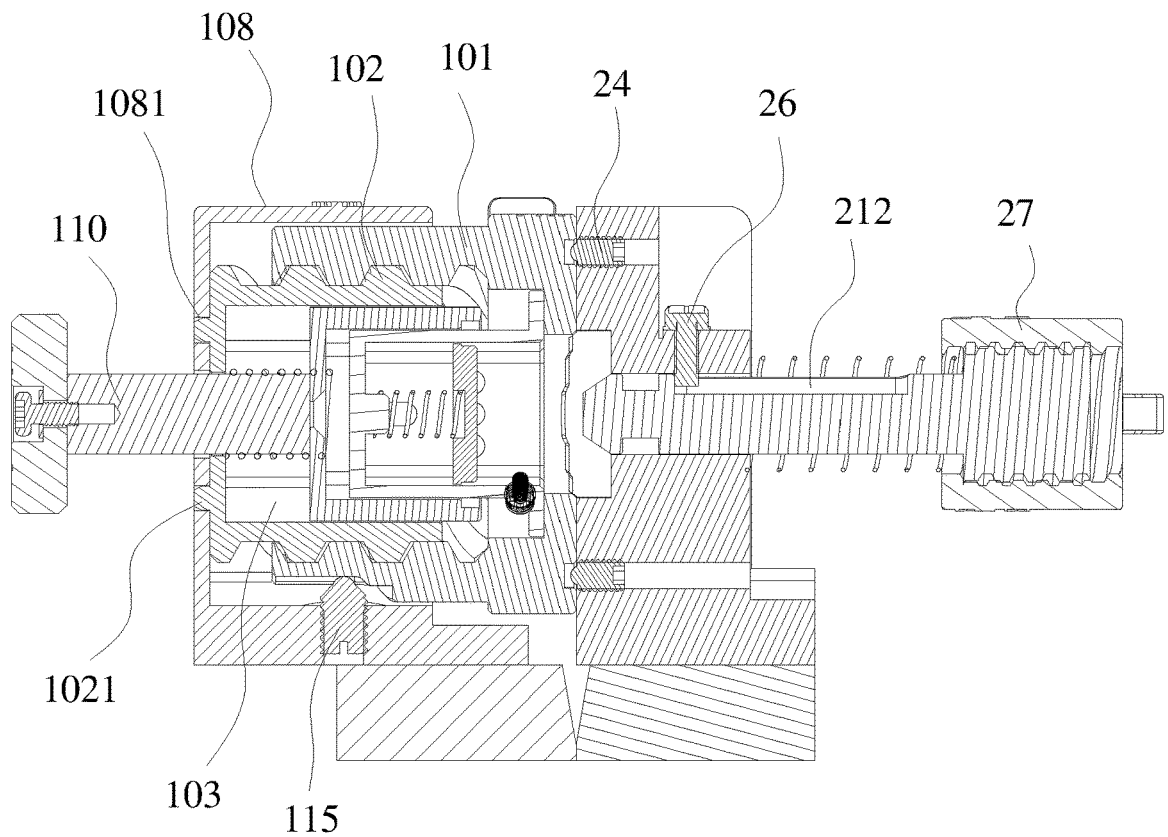
FIG. 6 is a schematic cross-sectional view of the cooperation between a first lock body and a second lock body provided by an embodiment of the present application.

As shown in FIG. 4 and FIG. 6, in an embodiment, the first lock body 1 further includes a fixed seat 108, and the angle adjusting component includes an angle adjuster 101 and an angle rotating seat 102, the angle adjuster 101 is internally provided with an internal thread, the angle rotating seat 102 is provided with an external thread, and the angle rotating seat 102 is screwed into the angle adjuster 101, and the angle rotating seat 102 is fixedly installed on the fixed seat 108 by a lock fixing screw 116.

As shown in FIG. 6, the fixed seat 108 is provided with a second positioning hole 1081, and the angle rotating seat 102 is provided with a second positioning post 1021, the second positioning post 1021 is inserted into the second positioning hole 1081, so that the installation position of the angle rotating seat 102 can be determined, and errors in the installation position are prevented. Preferably, both the second positioning post 1021 and the second positioning hole 1081 are provided with two, and each of the second positioning posts 1021 is connected in the second positioning hole 1081 in a one-to-one correspondence.

As shown in FIG. 4 and FIG. 7, in one embodiment, a flange 1061 is arranged at an end of the locking set 106 near the lock bar 21, and a locking set screw 104 is installed on the angle adjusting component, and the locking set screw 104 can extend into the cavity 103, the locking set screw 104 abuts against one side of the flange 1061 to fix the flange 1061 between the inner wall of the cavity 103 and the locking set screw 104, thereby the installation position of the locking set 106 is determined. When the angle adjuster 101 rotates to adjust the angle, the locking set 106 can move along with the angle adjuster 101.

In an embodiment, the locking set 106 is a cylindrical structure with one end closed and the other end open, the flange 1061 is arranged along the circumferential direction of the open end of the locking set 106, and the flange 1061 is limited between the locking set screw 104 and the inner wall of the angle adjuster 101. In this way, even if the angle adjuster 101 is rotated and the locking set screw 104 rotates along with the angle adjuster 101, the locking set screw 104 can still keep abutting on the flange 1061.

As shown in FIG. 4, FIG. 6 and FIG. 7, in an embodiment, the first lock body 1 further includes a button 109, a button push rod 110, a button spring 112, a set spring 113 and a lock bar push piece 114. The button 109 is installed at one end of the button push rod 110, the other end of the button push rod 110 is connected to the disengagement set 105, and the set spring 113 is sleeved outside the button push rod 110. The set spring 113 is arranged in the cavity 103, that is, the set spring 113 is arranged on the part of the button push rod 110 that extends into the cavity 103. When the lock bar 21 is not inserted into the first lock body 1, the set spring 113 is in a compressed state and abuts between the inner wall of the cavity 103 and the disengagement set 105.

The locking bar push piece 114 is arranged in the locking set 106 and can slide in the locking set 106, and the button spring 112 is connected between the lock bar push piece 114 and the locking set 106. Specifically, the closed end of the locking set 106 is provided with a first positioning post 1062, one end of the button spring 112 is connected to the first positioning post 1062, and the other end of the button spring 112 is connected to the lock bar push piece 114.

Preferably, when the lock bar 21 is not inserted into the first lock body 1, the initial position of the lock bar push piece 114 is at the locking piece 107, and the side edge of the lock bar push piece 114 abuts against the locking piece 107, so that the locking piece 107 is prevented from entering the locking set 106 when the lock bar 21 is not inserted.

When the lock bar 21 is inserted into the first lock body 1, the lock bar 21 abuts against the lock bar push piece 114. The lock bar push piece 114 is pushed to move, and the button spring 112 is compressed at the same time, so that the lock bar push piece 114 leaves the initial position, the side edge of the lock bar push piece 114 no longer abuts against the locking piece 107, and under the elastic force of the set spring 113, the first set segment 1051 of the disengagement set 105 pushes the locking piece 107 in the embedding slot 1063, and the first set segment 1051 is blocked at the embedding slot 1063, the locking piece 107 is prevented from returning to the position, and after the locking piece enters the cavity 103, it is locked in the slot 211 of the lock bar 21 to complete interlocking.

When unlocking, the button 109 is pulled to move away from the lock bar 21 to drive the disengagement set 105 to move together, and the first set segment 1051 disengages from the embedding slot 1063. The second set segment 1052 returns to the embedding slot 1063, and the button spring 112 in a compressed state pushes the lock bar push piece 114 to move toward the lock bar 21, thereby pushing the lock bar 21, since the first set segment 1051 no longer blocks the embedding slot 1063, the lock bar push piece 114 pushes the lock bar 21, and the locking piece 107 and the slot 211 are easily separated. The locking piece 107 re-enters the gap formed between the embedding slot 1063 and the second set segment 1052, unlocking the locking piece 107 and the slot 211, a side of the lock bar push piece 114 abuts against the locking piece 107 to prevent the locking piece 107 from entering the locking set 106.

In an embodiment, the disengagement set 105 is provided with a counterbore 1053, and the locking set 106 is provided with a waist hole 1064, and the counterbore 1053 and the waist hole 1064 are connected by a screw. The screw can move in the waist hole 1064, when the set spring 113 pushes the disengagement set 105 to move, and the button 109 is pulled to move and drive the disengagement set 105 to move, the movement stroke of the disengagement set 105 outside the locking set 106 can be limited, and the locking between the locking piece 107 and the slot 211 can be prevented from being affected by the excessive movement stroke of the disengagement set 105.

Figure 5:
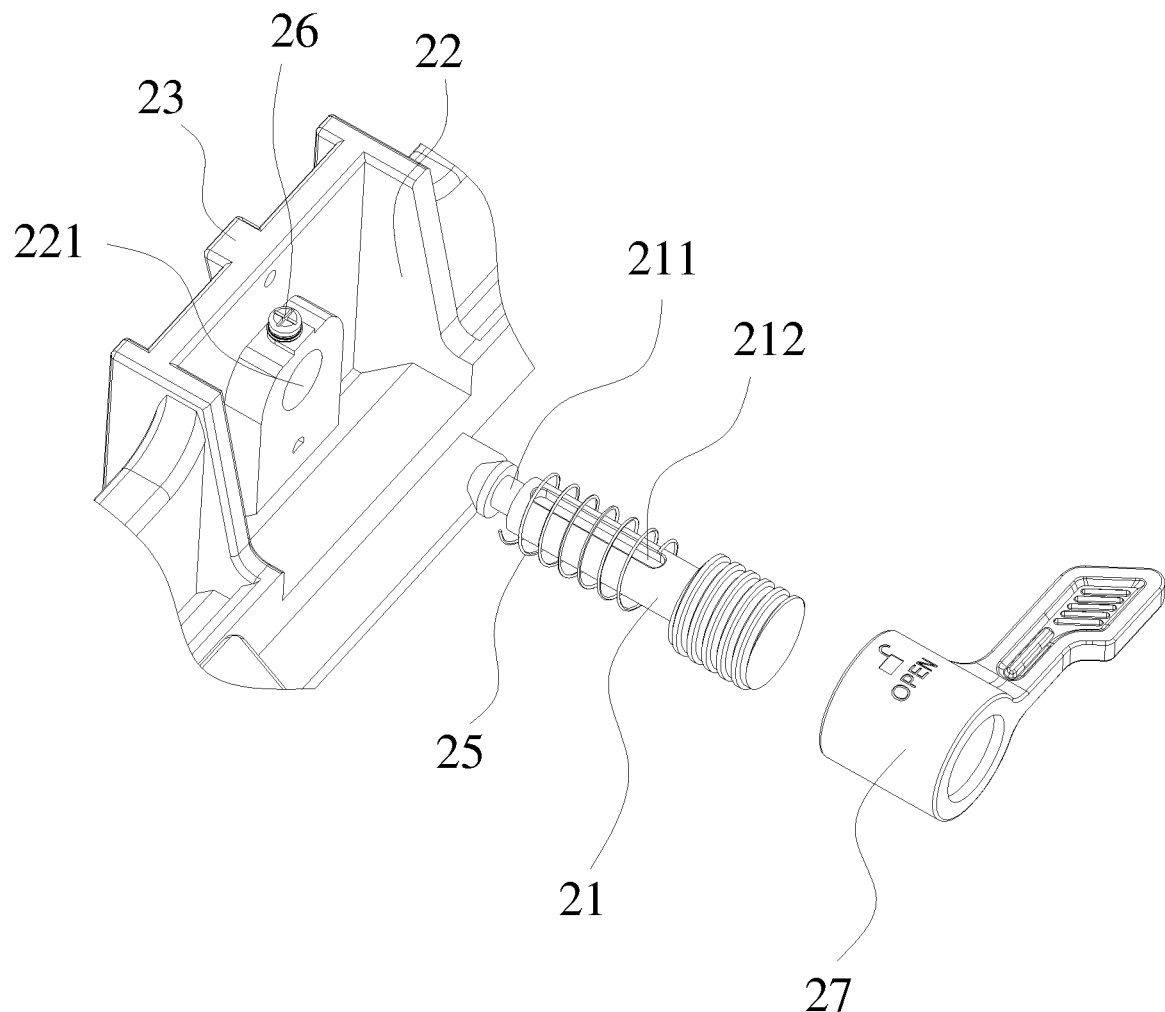
FIG. 5 is an exploded view of a second lock body provided by an embodiment of the present application.

As shown in FIG. 5, in one embodiment, the second lock body 2 further includes a lock bar connecting seat 22 and abutting block 23. The abutting block 23 is arranged at the side of the lock bar connecting seat 22 facing the first lock body 1. A plurality of inclined planes 1011 are uniformly arranged on the end face of the angle adjuster 101 facing the lock bar connecting seat 22 in the circumferential direction. The rotation of the angle adjuster 101 enables different inclined planes 1011 to abut against the abutting block 23, so as to change the splicing angle between two adjacent display screen units 3.

As shown in FIG. 4, in an embodiment, the number of the inclined planes 1011 is even, two inclined planes 1011 symmetrically arranged at 180° are coplanar, two adjacent inclined planes 1011 are not in the same plane, and different inclined planes 1011 have different thicknesses. Accordingly, the abutting blocks 23 are provided with two, and the two abutting blocks 23 respectively abut against two inclined planes 1011 symmetrically arranged at 180°.

As shown in FIG. 4, in an embodiment, the adjustable angles of the angle adjuster 101 are −7.5°, −5°, −2.5°, 0°. 2.5°, 5° and 7.5°. The thickness of the inclined plane 1011 increases sequentially along the direction of the inclined plane of 7.5° to the inclined plane of −7.5°. Wherein the inclined plane of 7.5° is the thinnest, the inclined plane of −7.5° is the thickest. Taking the inclined plane of 7.5° and the inclined plane of −7.5° as a dividing line, the inclined planes 1011 on the two sides are symmetrically arranged.

The inclined planes of 7.5° and −7.5° are on the same plane, and form an inclined surface. Similarly, the inclined planes of 5° and −5° are on the same plane, the inclined planes of 2.5° and −2.5° are on the same plane, and the inclination angle of the inclined surface formed by the inclined planes of 7.5° and −7.5° is the largest. The abutting block 23 abuts against two inclined planes 1011 on the same plane, so that the two display screen units 3 present different angles.

Figure 8:
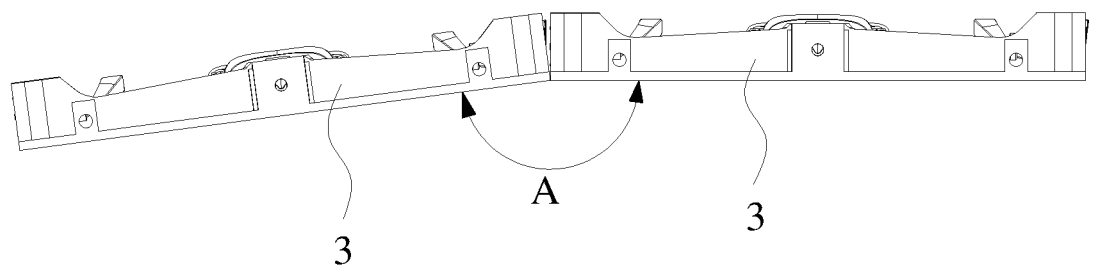
FIG. 8 is a schematic diagram of splicing when an angle adjuster provided by an embodiment of the present application is at an angle of −7.5°.

As shown in FIG. 8, it is a schematic diagram of splicing when the angle adjuster 101 is adjusted to −7.5°, and A is 172.5°.

Figure 9:
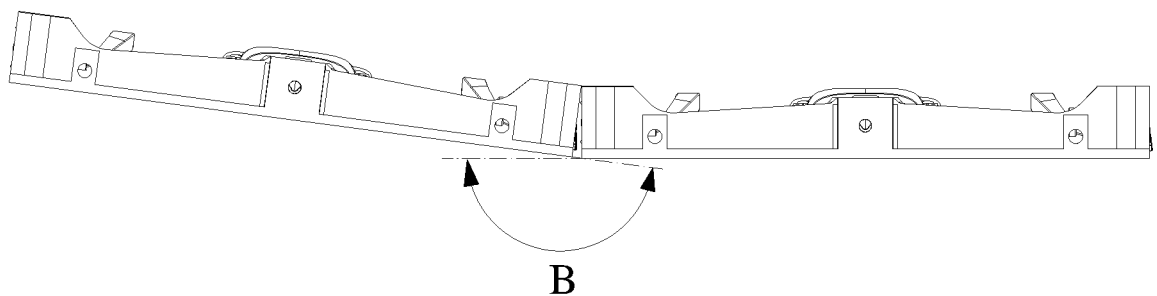
FIG. 9 is a schematic diagram of splicing when an angle adjuster provided by an embodiment of the present application is at an angle of 7.5°.

As shown in FIG. 9, it is a schematic diagram of splicing when the angle adjuster 101 is adjusted to 7.5°, and B is 172.5°.

Figure 10:
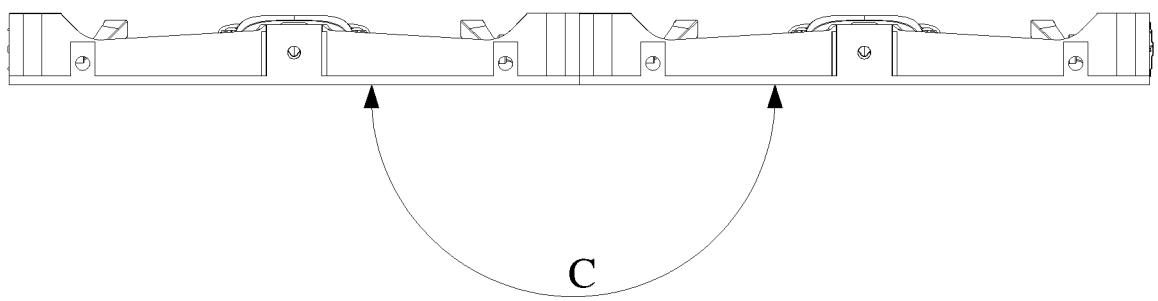
FIG. 10 is a schematic diagram of splicing when an angle adjuster provided by an embodiment of the present application is at an angle of 0°.

As shown in FIG. 10, it is a schematic diagram of splicing when the angle adjuster 101 is adjusted to 0°, and C is 180°.

Figure 2:
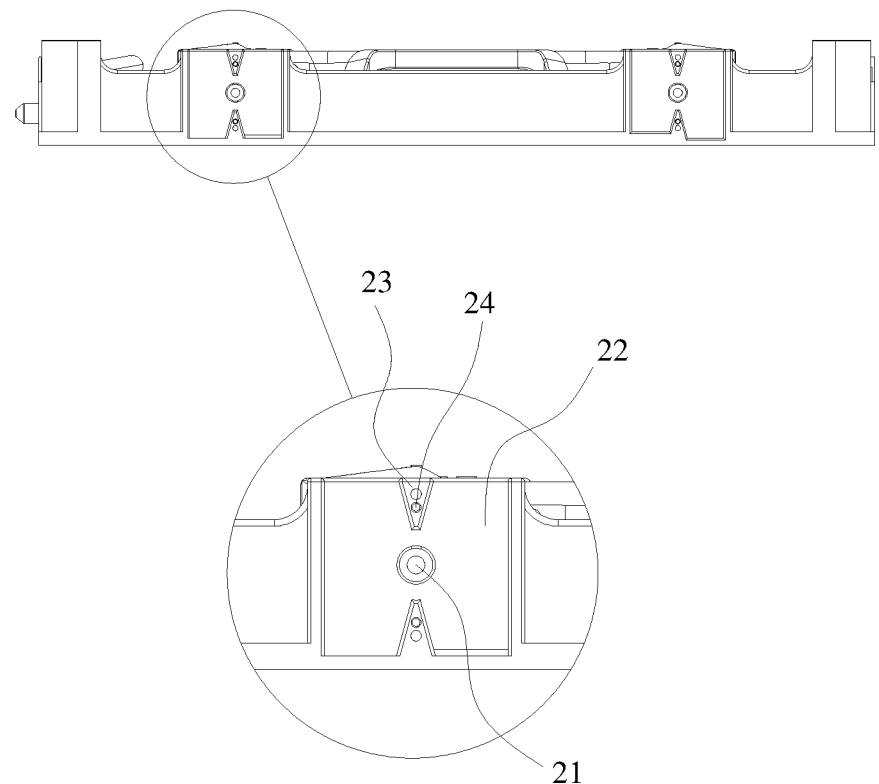
FIG. 2 is a schematic side view of FIG. 1 and a partial enlarged view of a second lock body.
Figure 3:
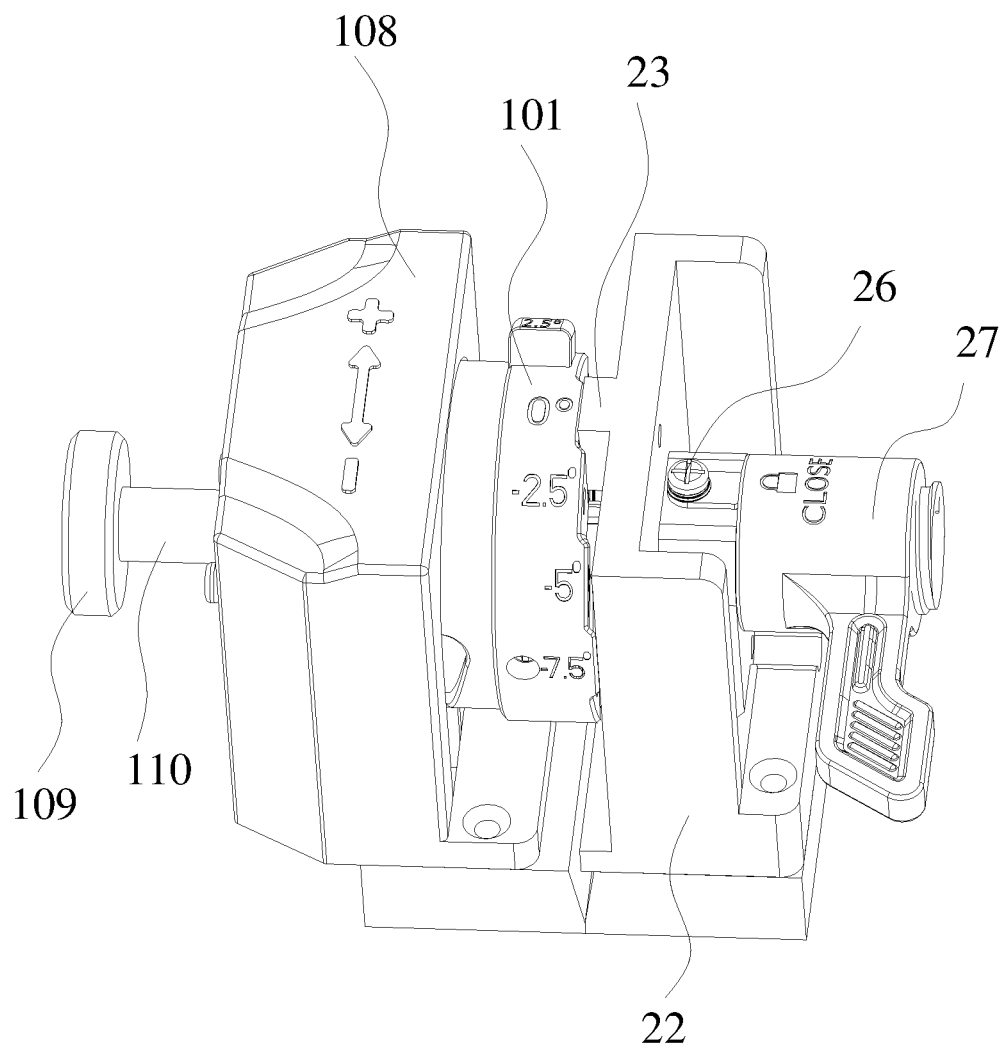
FIG. 3 is a schematic diagram of the cooperation between a first lock body and a second lock body provided by an embodiment of the present application.

As shown in FIG. 2 and FIG. 4, in an embodiment, a third positioning hole 1013 is arranged on each of the inclined plane 1011, and a third positioning post 24 is arranged on each of the abutting block 23. When the abutting block 23 abuts against the inclined plane 1011, the third positioning post 24 fits into the third positioning hole 1013.

As shown in FIG. 5, in an embodiment, the second lock body 2 further includes a reset spring 25, a limit pin 26 and a locking wrench 27, and the lock bar connecting seat 22 is provided with a lock bar channel 221, the lock bar channel 221 vertically extends through the lock bar connecting seat 22, and the lock bar 21 can pass through the lock bar channel 221 to enter or exit the first lock body 1. The limit pin 26 is installed on the lock bar connecting seat 22, the lock bar 21 is provided with a sliding groove 212, the limit pin 26 extends into the lock bar channel 221, and fits in the sliding groove 212. When the lock bar 21 moves, the limit pin 26 slides in the sliding groove 212, which can limit the moving direction of the lock bar 21, prevent the lock bar 21 from rotating, and prevent the lock bar 21 from separating from the lock bar connecting seat 22.

As shown in FIG. 5, in an embodiment, one end of the lock bar 21 is provided with the slot 211, and the other end of the lock bar 21 is provided with an external thread, that is, the end of the lock bar 21 away from the first lock body 1 is provided with an external thread, and the locking wrench 27 is screwed on the lock bar 21. The reset spring 25 is sleeved on the lock bar 21, and positioned between the lock bar connecting seat 22 and the locking wrench 27.

Preferably, the slot 211 is an annular groove, which can ensure that the slot 211 can be interlocked with the locking piece 107 (locking marble) after the angle adjuster 101 rotates.

When locking, firstly, the angle adjuster 101 is rotated to a required angle, and the lock bar 21 is inserted into the first lock body 1. After the lock bar 21 is interlocked with the locking piece 107, turn the locking wrench 27 to lock.

When unlocking, first rotate the locking wrench 27, unlock the lock bar 21, pull the button 109, and the button spring 112 pushes the lock bar push piece 114 to move. After unlocking the locking piece 107 and the slot 211, under the action of the reset spring 25 and the button spring 112, the lock bar 21 completely leaves the first lock body 1 and returns to the second lock body 2.

As shown in FIG. 4 and FIG. 6, in an embodiment, the angle adjuster 101 is provided with a plurality of glass bead grooves 1012 in the axial direction, and the glass bead grooves 1012 are arranged on the outer surface of the angle adjuster 101. The fixed seat 108 is provided with a glass bead screw 115, the glass bead screw 115 extends into the cavity 103 and is clamped in one of the glass bead grooves 1012. When the angle adjuster 101 is rotated, the glass bead screw 115 can be engaged with the glass bead grooves 1012 in different positions, and a "click" sound can be heard, indicating that the angle adjuster 101 has been rotated in place.

As shown in FIGS. 8 to 10, in another aspect, the embodiment of the present application provides a display screen assembly, including a plurality of display screen units 3 and a plurality of the arc-shaped locks as described above, and two adjacent display screen units 3 are spliced by the arc-shaped locks. The first lock body 1 and the second lock body 2 are arranged on each display screen unit 3, and the first lock body 1 and the second lock body 2 are arranged on different sides of the display screen unit 3.

In an embodiment, two adjacent display screen units 3 are spliced by two arc-shaped locks, at a joint of two adjacent display screen units 3, one of the display screen units is provided with a first lock body 1, and the other display screen unit is provided with a second lock body 2. The splicing of the two display screen units 3 is realized through the first lock body 1 and the second lock body 2.

In another embodiment (not shown), two adjacent display screen units 3 are spliced by two arc-shaped locks, at a joint of two adjacent display screen units 3, one of the display screen unit 3 is provided with a first lock body 1 of a first arc-shaped lock and a second lock body 2 of a second arc-shaped lock, the other display screen unit 3 is provided with a second lock body 2 of the first arc-shaped lock and a first lock body 1 of the second arc-shaped lock, and the two display screen unit 3 are spliced by the first lock body 1 and the second lock body 2.

The above are only preferred embodiments of the present application, and not intended to limit the present application. Any modifications, equivalent substitutions and improvements made within the spirit and principle of the present application shall be included in the protection scope of the present application.

What is claimed is:

1. An arc-shaped lock, used for splicing two adjacent display screen units, characterized by comprising a first lock body and a second lock body; the first lock body comprises an angle adjusting component, a disengagement set, a locking set and a locking piece, the angle adjusting component is used for adjusting a splicing angle between one of the two adjacent display screen units where the first lock body located and the other of the two adjacent display screen units where the second lock body located, the angle adjusting component is internally provided with a cavity for accommodating the disengagement set, the disengagement set is sleeved outside the locking set, and the locking piece is arranged on an outer wall of the locking set; and the second lock body comprises a lock bar, the lock bar is provided with a slot, and the lock bar is capable to extend into the locking set to make the disengagement set move relative to the locking set, the locking piece is pushed by the disengagement set to move toward the lock bar in the locking set, so that the locking piece is locked in the slot of the lock bar to realize temporary fixation of the first lock body and the second lock body.

2. The arc-shaped lock of claim 1, wherein the disengagement set comprises a first set segment and a second set segment, and the thickness of the second set segment is smaller than that of the first set segment, an outer wall of the locking set is provided with an embedding slot, the locking piece is arranged at a gap formed by the embedding slot and the second set segment, and the first set segment is used to extrude the locking piece when the locking set and the disengagement set move relative to each other.

3. The arc-shaped lock of claim 1, wherein one end of the locking set close to the lock bar is provided with a flange, and the angle adjusting component is provided with a locking set screw, the locking set screw abuts against one side of the flange to fix the flange between an inner wall of the cavity and the locking set screw.

4. The arc-shaped lock of claim 1, wherein the first lock body further comprises a button, a button push rod, a set spring, a button spring and a lock bar push piece; the button is installed at one end of the button push rod, another end of the button push rod is connected with the disengagement set, the set spring is sleeved outside the button push rod, and the set spring is arranged in the cavity; and the lock bar push piece is arranged in the locking set, and the button spring is connected between the lock bar push piece and the locking set.

5. The arc-shaped lock of claim 1, wherein a counterbore is arranged on the disengagement set, and a waist hole is arranged on the locking set, and the counterbore is connected with the waist hole to limit movement stroke of the disengagement set outside the locking set.

6. The arc-shaped lock of claim 1, wherein the first lock body further comprises a fixed seat, and the angle adjusting component comprises an angle adjuster and an angle rotating seat, and the angle adjuster is screwed outside the angle rotating seat, the angle rotating seat is installed on the fixed seat, the fixed seat is provided with a second positioning hole, the angle rotating seat is provided with a second positioning post, and the second positioning post is inserted into the second positioning hole.

7. The arc-shaped lock of claim 6, wherein the second lock body further comprises a lock bar connecting seat and an abutting block, the abutting block is arranged at one side of the lock bar connecting seat facing the first lock body, a plurality of inclined planes are uniformly arranged on an end surface of the angle adjuster facing the lock bar connecting seat in circumferential direction, and the angle adjuster rotates to make different inclined planes abut against the abutting block to change the splicing angle between two adjacent display screen units.

8. The arc-shaped lock of claim 7, wherein the second lock body further comprises a reset spring, a limit pin and a locking wrench, a lock bar channel is arranged on the lock bar connecting seat, and the lock bar passes through the lock bar channel to enter or exit the first lock body; an end of the lock bar away from the first lock body is provided with an external thread, the locking wrench is screwed on the lock bar, the reset spring is sleeved on the lock bar, and the reset spring is positioned between the lock bar connecting seat and the locking wrench; the lock bar is provided with a sliding groove, and the limit pin is fitted in the sliding groove.

9. A display screen assembly, comprising a plurality of display screen units and a plurality of the arc-shaped locks of claim 1, wherein two adjacent display screen units are spliced by the arc-shaped locks.

10. The display screen assembly of claim 9, wherein two adjacent display screen units are spliced by two arc-shaped locks, at a joint of two adjacent display screen units, one of the display screen units is provided with a first lock body, and the other display screen unit is provided with a second lock body.

11. A display screen assembly, comprising a plurality of display screen units and a plurality of the arc-shaped locks of claim 2, wherein two adjacent display screen units are spliced by the arc-shaped locks.

12. A display screen assembly, comprising a plurality of display screen units and a plurality of the arc-shaped locks of claim 3, wherein two adjacent display screen units are spliced by the arc-shaped locks.

13. A display screen assembly, comprising a plurality of display screen units and a plurality of the arc-shaped locks of claim 4, wherein two adjacent display screen units are spliced by the arc-shaped locks.

14. A display screen assembly, comprising a plurality of display screen units and a plurality of the arc-shaped locks of claim 5, wherein two adjacent display screen units are spliced by the arc-shaped locks.

15. A display screen assembly, comprising a plurality of display screen units and a plurality of the arc-shaped locks of claim 6, wherein two adjacent display screen units are spliced by the arc-shaped locks.

16. A display screen assembly, comprising a plurality of display screen units and a plurality of the arc-shaped locks of claim 7, wherein two adjacent display screen units are spliced by the arc-shaped locks.

17. A display screen assembly, comprising a plurality of display screen units and a plurality of the arc-shaped locks of claim 8, wherein two adjacent display screen units are spliced by the arc-shaped locks.

* * * * *